(12) United States Patent
Maeda (10) Patent No.: US 7,629,689 B2
(45) Date of Patent: Dec. 8, 2009

(54) SEMICONDUCTOR INTEGRATED CIRCUIT HAVING CONNECTION PADS OVER ACTIVE ELEMENTS

(75) Inventor: Jun Maeda, Mihama-ku (JP)

(73) Assignee: Kawasaki Microelectronics, Inc., Chiba (JP)

(*) Notice: Subject to any disclaimer, the term of this patent is extended or adjusted under 35 U.S.C. 154(b) by 324 days.

(21) Appl. No.: 11/032,099

(22) Filed: Jan. 11, 2005

(65) Prior Publication Data

US 2005/0161835 A1 Jul. 28, 2005

(30) Foreign Application Priority Data

Jan. 22, 2004 (JP) .............. 2004-014080

(51) Int. Cl.
H01L 23/48 (2006.01)
H01L 23/52 (2006.01)
H01L 29/40 (2006.01)

(52) U.S. Cl. .............. 257/758; 257/E23.002

(58) Field of Classification Search ........ 257/758, 257/E23.002
See application file for complete search history.

(56) References Cited

U.S. PATENT DOCUMENTS

| | | | |
|---|---|---|---|
| 5,365,091 A * | 11/1994 | Yamagishi | 257/203 |
| 5,394,013 A | 2/1995 | Oku | |
| 5,751,065 A | 5/1998 | Chittipeddi et al. | |
| 5,986,343 A | 11/1999 | Chittipeddi et al. | |
| 6,008,542 A | 12/1999 | Takamori | |
| 6,022,791 A * | 2/2000 | Cook et al. | 438/458 |
| 6,100,589 A | 8/2000 | Tanaka | |
| 6,143,396 A * | 11/2000 | Saran et al. | 428/162 |
| 6,163,075 A | 12/2000 | Okushima | |
| 6,229,221 B1 | 5/2001 | Kloen et al. | |
| 6,232,662 B1 * | 5/2001 | Saran | 257/750 |
| 6,297,563 B1 | 10/2001 | Yamaha | |
| 6,448,650 B1 | 9/2002 | Saran et al. | |
| 6,489,228 B1 | 12/2002 | Vigna et al. | |
| 6,495,917 B1 | 12/2002 | Ellis-Monaghan et al. | |
| 6,559,548 B1 * | 5/2003 | Matsunaga et al. | 257/774 |
| 6,586,839 B2 | 7/2003 | Chisholm et al. | |

(Continued)

FOREIGN PATENT DOCUMENTS

JP A-11-307724 11/1999

(Continued)

OTHER PUBLICATIONS

W. Anderson et al., "ESD Protection Under Wire Bonding Pads", 1999 EOS/ESD Symposium, pp. 88-94.

(Continued)

*Primary Examiner*—Kiesha L Rose
*Assistant Examiner*—Igwe U Anya
(74) *Attorney, Agent, or Firm*—Oliff & Berridge, PLC (57) ABSTRACT

A semiconductor integrated circuit having connection pads arranged over active elements is disclosed. The connection pad is divided into a probing area and a bonding area, and reinforcing structures are formed separately under the respective areas. The reinforcing structure under the probing area is formed using a number of wiring layers less than the number of wiring layers used for forming the reinforcing structure under the bonding area. As a result, the wiring layers under the probing area are efficiently utilized to forms wires for realizing the logical function of the integrated circuit.

17 Claims, 4 Drawing Sheets

U.S. PATENT DOCUMENTS

| | | | |
|---|---|---|---|
| 6,614,091 B1 | 9/2003 | Downey et al. | |
| 6,731,007 B1* | 5/2004 | Saito et al. | 257/762 |
| 6,762,499 B2 | 7/2004 | Nakadaira | |
| 6,803,302 B2* | 10/2004 | Pozder et al. | 438/612 |
| 6,822,329 B2 | 11/2004 | Varrot et al. | |
| 6,881,597 B2* | 4/2005 | Asayama et al. | 438/18 |
| 6,890,828 B2* | 5/2005 | Horak et al. | 438/319 |
| 6,921,979 B2* | 7/2005 | Downey et al. | 257/773 |
| 7,015,588 B2* | 3/2006 | Komatsu | 257/780 |
| 7,038,280 B2* | 5/2006 | Righter | 257/355 |
| 7,071,575 B2* | 7/2006 | Wu et al. | 257/786 |
| 7,091,613 B1* | 8/2006 | Long et al. | 257/758 |
| 7,115,985 B2* | 10/2006 | Antol et al. | 257/700 |
| 7,157,734 B2 | 1/2007 | Tsao et al. | 257/48 |
| 2003/0168748 A1* | 9/2003 | Katagiri et al. | 257/778 |
| 2003/0230809 A1* | 12/2003 | Nakajima et al. | 257/758 |
| 2004/0016949 A1* | 1/2004 | Semi | 257/300 |
| 2004/0150112 A1 | 8/2004 | Oda | |
| 2005/0167842 A1* | 8/2005 | Nakamura et al. | 257/758 |

FOREIGN PATENT DOCUMENTS

| | | |
|---|---|---|
| JP | A-2000-164620 | 6/2000 |
| JP | A-2001-7113 | 1/2001 |
| JP | A-2002-16069 | 1/2002 |
| JP | A-2002-76075 | 3/2002 |
| JP | A-2002-319587 | 10/2002 |
| JP | A-2002-329742 | 11/2002 |

OTHER PUBLICATIONS

L. Mercado et al., "Reliability of Multi-layer Aluminum Capped Copper Interconnect Structures", 2000 International Electronics Manufacturing Technology Symposium, pp. 84-94.

K-Y. Chou et al., "ESD Protection Under Grounded-Up Bond Pads in 0.13 μm Eight-Level Copper Metal, Fluorinated Silicate Glass Low-k Intermetal Dielectric CMOS Process Technology", IEEE Electron Device Letters, vol. 22, No. 7, Jul. 2001, pp. 342-344.

K-Y. Chou et al., Active Devices Under CMOS I/O Pads, IEEE Trans Electron Devices, vol. 49, No. 12, Dec. 2002, pp. 2279-2287.

M-D. Ker et al.., "Test Structure and Verification on the MOSFET Under Bond Pad for Area-efficient I/O Layout in High-pin-count SOC IC's", 2003 IEE International Conference on Microelectronic Test Structures, pp. 161-166.

K. J. Hess et al., Reliability of Bond Over Active Pad Structure for 0.13 -μm CMOS Technology, 2003 Electronic Components and Technology Conference, pp. 1344-1349.

Y. Liu, Thermosonic Wire Bonding Process Simulation and Bond Pad Over Active Stress Analysis, 2004 Electronic Components and Technology Conference, pp. 383-391.

* cited by examiner

SEMICONDUCTOR INTEGRATED CIRCUIT HAVING CONNECTION PADS OVER ACTIVE ELEMENTS

This invention was first described in Japanese Patent Application No. 2004-14080, which is hereby incorporated by reference in its entirety.

BACKGROUND

This invention is related to semiconductor integrated circuits having connection pads (pads for external connections) arranged over active elements.

Connection pads are often used for probing during testing of a semiconductor integrated circuit. Connection pads are also used for wire bonding when assembling the semiconductor integrated circuit. Previously, the connection pads were not arranged over an active element-forming area where active elements such as transistors are formed, in order to prevent the active elements from being damaged by the mechanical stress applied for the bonding and/or probing.

However, the need for miniaturization of the elements increases the number of functions implemented in a semiconductor integrated circuit; and also increases the required number of connection pads to be placed on the semiconductor integrated circuit. Therefore, it may be highly desirable to reduce the chip area of the semiconductor integrated circuit by arranging the connection pads over the active elements.

For example, U.S. Pat. No. 6,232,662 (Patent Document 1), which is hereby incorporated by reference in its entirety, proposes to arrange a bonding pad over the active integrated circuit region by providing a conductive reinforcing structure that includes a grid-shaped metal wiring pattern below the bonding pad.

As explained above, connection pads may also be used, before they are used for wire bonding, for probing by probing needles. The probing needle often damages the surface of the pad during the probing, and the damage on the surface of the pad may cause failure of the bonding.

For example, Japanese Laid-open Patent No. 2000-164620 (Patent Document 2), which is hereby incorporated by reference in its entirety, proposes a countermeasure for this problem. That is, Patent Document 2 proposes to form the pad in a rectangular shape and to divide it in two portions, one for bonding and one for probing.

It may be possible to arrange connection pad, which is divided into a bonding area and a probing area, as proposed by Patent Document 2, over the active elements, as proposed by Patent Document 1. Thereby, it would be possible to prevent bonding failure and to reduce the area of the chip.

However, even with an advanced manufacturing process that permits the use of a large number of wiring layers, the utilization rate of the wiring layers, or the utilization rate of the wiring resources provided by the wiring layers, may be significantly lowered if the reinforcing structure uses many of the wiring layers. As a result, it becomes difficult to arrange a number of wires necessary to realize the logical function of the integrated circuitry under the connection pad. In fact, a conventional I/O circuitry that was not designed to be arranged under a connection pad may utilize a significant number of wiring layers. Such conventionally designed I/O circuitry generally cannot be placed under the connection pad.

SUMMARY

An object of this invention is to solve the above-mentioned problems. That is, an object of this invention is to provide a semiconductor integrated circuit that allows to arrange bonding pads over active elements without damaging the active elements, and, at the same time, to improve the utilization efficiency of the wiring resources under the connection pad.

In order to solve the above-mentioned problems, according to an exemplary aspect of this invention, an exemplary semiconductor integrated circuit having a logical function is provided on a surface of a semiconductor substrate. The exemplary semiconductor integrated circuit may include an active element-forming area for forming a plurality of active elements on the surface of the semiconductor substrate; a plurality of wiring layers over the surface of the semiconductor substrate; and a connection pad formed over the plurality of wiring layers and arranged at least partly over the active element-forming area. The connection pad is divided into a probing area for probing and a bonding area for wire bonding. The semiconductor integrated circuit may further include a first reinforcing structure between the probing area and the active element-forming area formed by using at least one of the plurality of wiring layers such that another one or more of the plurality of wiring layers can be utilized to form circuit wires for realizing the logical function of the semiconductor integrated circuit under the first reinforcing structure; and a second reinforcing structure between the bonding area and the active element-forming area formed by using the at least one of the plurality of wiring layers and an additional one of the plurality of wiring layers under the at least one of the plurality of wiring layers.

In the exemplary semiconductor integrated circuit, the at least one of the plurality of wiring layers may include an upper-most one of the plurality of wiring layers.

Also, the connection pad may include an interlayer connection area separate from the bonding area and the probing area; and the connection pad is formed on an interlayer dielectric film in which an interlayer contact that contacts the connection pad is arranged under the interlayer connection area. Furthermore, the interlayer dielectric film may be continuous under the probing area and the bonding area of the connection pad.

In order to solve the above-mentioned problems, according to another exemplary aspect of this invention, an exemplary semiconductor integrated circuit includes an active element-forming area for forming a plurality of active elements on the surface of the semiconductor substrate; a plurality of wiring layers over the surface of the semiconductor substrate; and a connection pad formed over the plurality of wiring layers and arranged at least partly over the active element-forming area. The connection pad is divided into a probing area for probing and a bonding area for wire bonding. The exemplary semiconductor integrated circuit may further include circuit wires for realizing the logical function of the semiconductor integrated circuit; a first reinforcing structure between the probing area and the active element-forming area; and a second reinforcing structure between the bonding area and the active element-forming area. The circuit wires may be formed in at least one of the plurality of wiring layers under the bonding area and the probing area and also in an additional one of the plurality of wiring layers over the at least one of the plurality of wiring layers under the probing area; the first reinforcing structure may be formed over the additional one of the plurality of wiring layers; and the second reinforcing structure may be formed over the at least one of the plurality of wiring layers.

In the exemplary semiconductor integrated circuit, preferably; none of the circuit wires is formed in the additional one of the plurality of wiring layers under the bonding area.

In order to solve the above-mentioned problems, according to still another exemplary aspect of this invention, an exemplary semiconductor integrated circuit may include an active element-forming area on the surface of the semiconductor substrate for forming a plurality of active elements; a plurality of wiring layers for providing wiring resources over the surface of the semiconductor substrate; and a connection pad formed over the plurality of wiring layers and arranged at least partly over the active element-forming area. The connection pad is divided into a probing area for probing and a bonding area for wire bonding. The exemplary semiconductor integrated circuit may further include a first reinforcing structure between the probing area and the active element-forming area formed by consuming a first portion of the wiring resources under the probing area provided by at least one of the plurality of wiring layers so that another portion of the wiring resources provided by another one or more of the plurality of wiring layers can be utilized to form circuit wires for realizing the logical function of the semiconductor integrated circuit under the first reinforcing structure; and a second reinforcing structure between the bonding area and the active element-forming area may be formed by consuming a second portion of the wiring resources under the bonding area provided by the at least one of the plurality of wiring layers and an additional one of the plurality of wiring layers under the at least one of the plurality of wiring layers.

In the exemplary semiconductor integrated circuit, at least one of the circuit wires may be formed in the additional one of the plurality of wiring layers under the first reinforcing structure.

In order to solve the above-mentioned problems, according to an exemplary aspect of this invention, an exemplary method for manufacturing a semiconductor integrated circuit having a logical function on the surface of a semiconductor substrate is provided. The exemplary method may include forming a plurality of active elements in an active element-forming area on the surface of the semiconductor substrate; forming a plurality of wiring layers over the surface of the semiconductor substrate; and forming a connection pad over the plurality of wiring layers. The connection pad may be arranged at least partly over the active element-forming area and divided into a probing area and a bonding area. The exemplary method may further include probing the semiconductor integrated circuit by contacting a probing needle onto the probing area of the connection pad; and bonding a bonding wire to the bonding area of the connection pad. The forming of the plurality of wiring layers may include forming a first reinforcing structure between the probing area and the active element-forming area by using at least one of the plurality of wiring layers such that the first reinforcing structure prevents the active elements from being damaged during the probing, and such that another one or more of the plurality of wiring layers can be utilized to form circuit wires for realizing the logical function of the semiconductor integrated circuit under the first reinforcing structure; and forming a second reinforcing structure between the bonding area and the active element-forming area by using the at least one of the plurality of wiring layers and an additional one of the plurality of wiring layers under the at least one of the plurality of wiring layers such that the second reinforcing structure prevents the active elements from being damaged during the bonding.

In the exemplary method, the forming of the plurality of wiring layers may further include forming at least one of the circuit wires by utilizing the additional one of the plurality of wiring layers under the first reinforcing structure.

In order to solve the above-mentioned problems, according to another exemplary aspect of this invention, an exemplary method for manufacturing a semiconductor integrated circuit may include forming a plurality of active elements in an active element-forming area on the surface of the semiconductor substrate; forming a plurality of wiring layers over the surface of the semiconductor substrate; and forming a connection pad over the plurality of wiring layers. The connection pad may be arranged at least partly over the active element-forming area and divided into a probing area and a bonding area. The exemplary method may further include probing the semiconductor integrated circuit by contacting a probing needle onto the probing area of the connection pad; and bonding a bonding wire to the bonding area of the connection pad. The forming of the plurality of wiring layers may include forming circuit wires for realizing the logical function of the semiconductor integrated circuit by utilizing at least one of the plurality of wiring layers under the bonding area and the probing area and also by utilizing an additional one of the plurality of wiring layers over the at least one of the plurality of wiring layers under the probing area; forming a first reinforcing structure over the additional one of the plurality of wiring layers such that the first reinforcing structure is positioned between the probing area and the active element-forming area and such that the first reinforcing structure prevents the active elements from being damaged during the probing; and forming a second reinforcing structure over the at least one of the plurality of wiring layers such that the second reinforcing structure is positioned between the bonding area and the active element-forming area, and such that the second reinforcing structure prevents the active elements from being damaged during the bonding.

In the exemplary method, preferably, none of the circuit wires is formed by utilizing the additional one of the plurality of wiring layers under the bonding area.

DETAILED DESCRIPTION OF EMBODIMENTS

An exemplary semiconductor integrated circuit according to an exemplary implementation of this invention will be explained in detail, in reference to the drawings.

Figure 1:
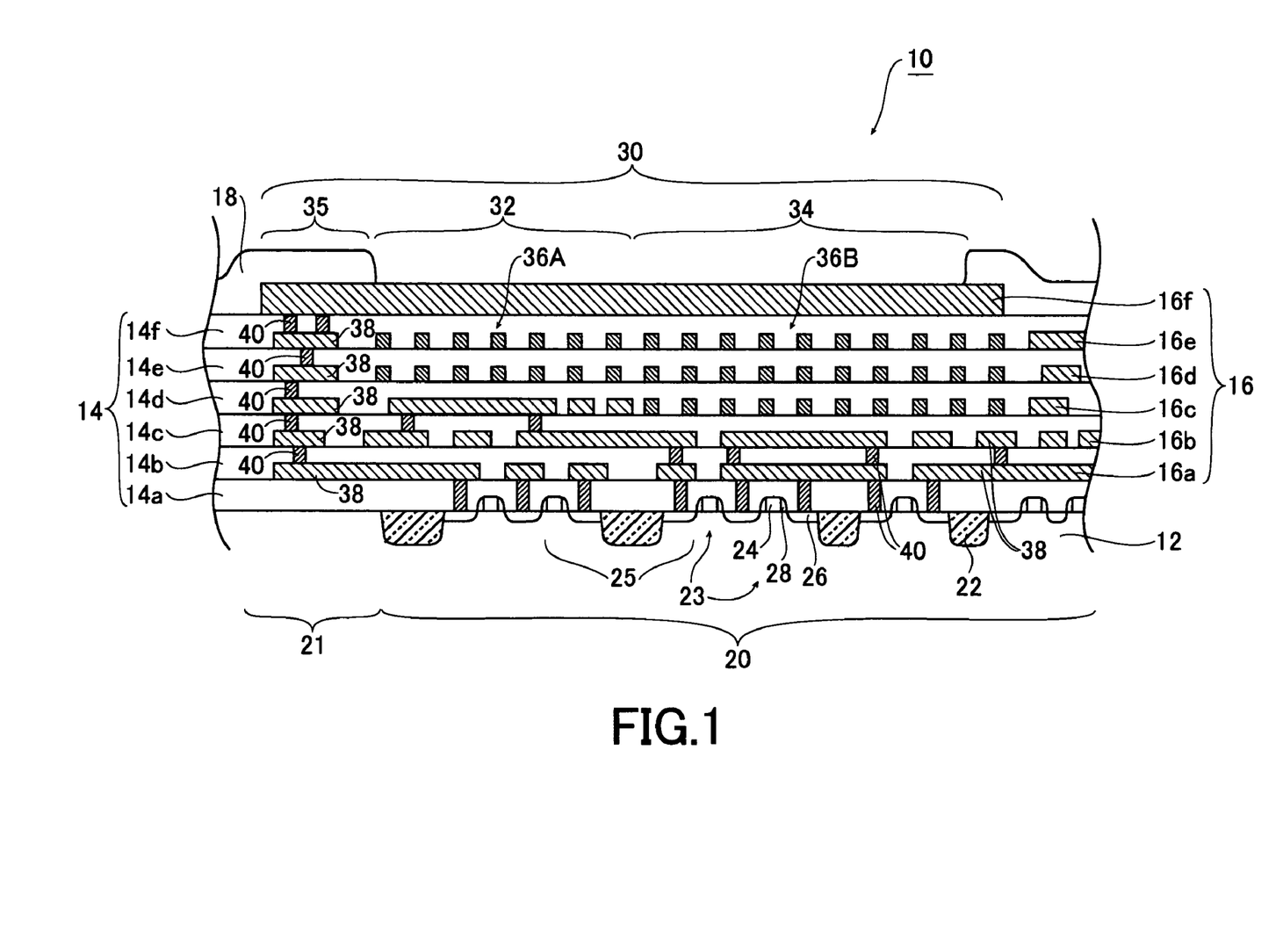
FIG. 1 shows a partial cross-sectional view of an exemplary semiconductor integrated circuit according to an exemplary implementation of the invention.

FIG. 1 shows a partial cross-sectional view of a layout of an exemplary semiconductor integrated circuit according to an exemplary implementation of invention. The exemplary semiconductor integrated circuit 10 shown in this figure utilizes six wiring layers. Over the surface of a silicon substrate 12, from the first through the sixth interlayer dielectric films 14 (14a through 14f) and from the first through the sixth wiring layers 16 (16a through 16f) are formed.

According to various implementations, the entire surface area of the silicon substrate 12 shown in FIG. 1, except for an outside area 21 on the left-most portion, is the active element-forming area 20 for forming active elements. The active element-formation area 20 is divided into a plurality of active regions 25 by field isolation regions 22, and a plurality of active elements 23 is formed in their respective active regions.

In the exemplary semiconductor integrated circuit shown in FIG. 1, CMOS (Complementary Metal-Oxide-Silicon) transistors are formed in their respective active regions. Each of the transistors has a gate electrode 24 and source/drain regions 26. The gate electrode 24 is formed over the active region on the surface of the silicon substrate 12. Moreover, sidewall spacers 28 are formed on both sides of the gate electrode 24.

In the exemplary semiconductor integrated circuit shown in FIG. 1, the silicon substrate 12 is used as an example of the semiconductor substrate. Other semiconductor substrates such as a SOI (Silicon-on-Insulator) substrate, and substrates with other semiconductive materials may also be used. Moreover, the active elements are not limited to the CMOS transistors. Other active elements, such as bipolar transistors, diodes, thyristors, or the like, may also be formed in the active element-formation area 20.

According to various implementations, the first through the sixth interlayer dielectric films 14 (14a through 14f) and the first through the sixth wiring layers 16 (16a through 16f) are provided for forming the wires (circuit wires) 38, which are used for, for example, connecting the active elements to each other, and for connecting the connection pad 30 to the active elements. The first interlayer dielectric film 14a is formed on the surface of the silicon substrate 12 having the active elements 23 thereon. On the first interlayer dielectric film 14a, the first through the sixth wiring layers (16a through 16f) and the second through the sixth interlayer dielectric films (14b through 14f) are alternately stacked one by one.

According to various implementations, among these wiring layers 16, the upper-most (the sixth) wiring layer 16f is used for forming the connection pad 30. Under the connection pad 30, the remaining wiring layers, i.e., the first through the fifth wiring layers 16a through 16e can be utilized for other purposes. Typically, the upper-most wiring layer used for forming the connection pad 30 is made of an aluminum alloy (an alloy containing predominantly aluminum). The remaining wiring layers may also be made of an aluminum alloy. Alternatively, the remaining wiring layers may be made of copper or a copper alloy (an alloy containing predominantly copper).

According to various implementations, the connection pad 30 is arranged at least partly over the active element-forming area 20, and is divided into a bonding area 34 (at the right side of the pad 30 in the drawing) and a probing area 32 (at the left side of the pad 30 in the drawing). By dividing the connection pad 30 into the probing area 32 and bonding area 34, any defect in the bonding, originated by the damage formed during the probing, can be prevented.

According to various implementations, a passivation film 18 is formed to cover the entire upper surface of the semiconductor integrated circuit, i.e., over the surface of the sixth interlayer dielectric film 14f and the outer periphery of the connection pad 30, such that the probing area 32 and the bonding area 34 are exposed.

According to various implementations, under the probing area 32 and under the bonding area 34 of the connection pad, respective reinforcing structures 36A and 36B are formed. The reinforcing structure 36A under the probing area 32 is formed in order to prevent the active elements under the probing area 34 from being damaged during probing. The reinforcing structure 36B under the bonding area 34 is formed in order to prevent the active elements under the bonding area from being damaged during bonding. The reinforcing structures 36A and 36B include dummy patterns, which do not contribute to the logical function of the semiconductor integrated circuit 10, formed in at least one of the wiring layers.

In the exemplary semiconductor integrated circuit shown in FIG. 1, the fourth and the fifth wiring layers (16d and 16e) are used to form the reinforcing structure 36A under the probing area 32. On the other hand, the third through the fifth wiring layers (16c through 16e) are used to form the reinforcing structure 36B under the bonding area 34. That is, the reinforcing structure 36A under the probing area 32 is formed by using a number of wiring layers less than, by at least one, the number of layers used for forming the reinforcing structure 36B under the bonding area 34.

According to various implementations, the reinforcing structure 36A under the probing area 32 is formed by using one or more of the wiring layers, while the reinforcing structure 36B under the bonding area 34 is formed by using the same one or more of the wiring layers, and at least an additional one of the wiring layers. Specifically, in the exemplary semiconductor integrated circuit shown in FIG. 1, the reinforcing structure 36A utilizes the fifth wiring layer 16e, which is immediately under the layer used for forming the connection pad 30 (the sixth wiring layer 16f) and the next lower wiring layer, i.e., the fourth wiring layer 16d. The reinforcing structure 36B uses the same two wiring layers and further utilizes the next lower wiring layer, i.e., the third wiring layer 16c.

It should be noted that, as previously explained, the upper-most one of the wiring layers (the sixth wiring layer 16f) is used to form the connection pad 30, and, under the connection pad 30, only the remaining ones of the wiring layers can be utilized for other purposes. Thus, the reinforcing structure 36A and 36B are formed by using the upper-most one, and one or two next lower ones, of the usable ones of the wiring layers 16.

Moreover, wires (circuit wires) 38 are formed under the reinforcing structures 36A and 36B. The wires 38 are used for forming the circuitry of the semiconductor integrated circuit 10 by, for example, connecting the active elements 23 with each other.

According to various implementations, when the active elements 23 for forming an I/O circuitry are formed in the active element-forming area 30 under the connection pad 30, for example, the wires 38 under the reinforcing structures 36A and 36B connect the active elements with each other and supply power-supply voltages to the transistors. Thereby, the I/O circuitry is constructed. The wires 38 further connect the I/O circuitry to the connection pad 30 and also to internal circuitries of the semiconductor integrated circuit 10. Thus, the wires 38, together with the active elements 23, realize the logical function of the semiconductor integrated circuit.

More specifically, in the exemplary semiconductor integrated circuit 10 shown in FIG. 1, under the reinforcing structure 36A under the probing area 32, the wires 38 formed in the first through the third wiring layers (16a through 16c) and interlayer contacts 40 formed in the first through the third interlayer dielectric films (14a through 14c) connect the active elements 23 with each other. On the other hand, under the reinforcing structure 36B under the bonding area 34, wires 38 formed in the first and the second wiring layers 16a and 16b and interlayer contacts 40 formed in the first and the second interlayer dielectric films 14a and 14b connect the active elements 23 with each other.

According to various implementations, in the exemplary semiconductor integrated circuit 10 shown in FIG. 1, wires 38 under the probing area 32 and the bonding area 34 are formed by utilizing at least the lower-most wiring layer 16a and, optionally, one or more of the next higher wiring layers (16b, 16c, and so on). According to this invention, it is not always necessary, to form wires 38 under both the probing area 32 and the bonding area 34 by using at least one of the wiring layers.

According to various implementations, in the exemplary semiconductor integrated circuit 10, the number of the wiring layers utilized for forming the wires 38 under the probing area 32 is larger, at least by one, than the number of the wiring layers utilized for forming the wires 38 under the bonding area 34. In other words, under the probing area, the wires 38 for realizing the logical function of the semiconductor integrated circuit is formed by utilizing at least one of the wiring layers, which is utilized for forming the wires 38 under the bonding area, and at least an additional one of the wiring layers.

Thus, among the plurality of wiring layers, or the wiring resources provided by the plurality of wiring layers, one or more upper wiring layers, or the resources provided by the one or more upper layers, are used, or consumed, for forming the reinforcing structures 36A and 36B. On the other hand, one or more lower wiring layers, or the resources provided by the one or more lower wiring layers, are utilized for forming the wires 38 for realizing the logical function of the integrated circuit 10. Moreover, the reinforcing structure 36A under the probing area 32 uses a number of wiring layers that is less than the number of wiring layers used by the reinforcing structure 36B under the bonding area 34. The reinforcing structure 36A consumes a lesser amount of wiring resources than that consumed by the reinforcing structure 36B. Accordingly, under the probing area 32, a larger number of wiring layers, or a larger amount of wiring resources provided by the larger number of wiring layers, can be utilized to form the wires 38 for realizing the logical function, compared with the smaller number of wiring layers, or the amount of wiring resources, that can be utilized under the bonding area 34.

According to various implementations, the connection pad 30 in the exemplary semiconductor integrated circuit 10 shown in FIG. 1 has an interlayer connection area 35 that is separate from the probing area 32 and the bonding area 34. According to various implementations, the interlayer connection area 35 is located at the left-most portion of the connection pad 30 in the drawing, and is covered with the passivation film 18. According to various implementations, the interlayer connection area 35 is positioned over an outer area 21 of the surface of the semiconductor substrate 12, which is outside of the active element-forming area 20.

According to various implementations, the exemplary semiconductor integrated circuit 10 shown in FIG. 1 also includes the wires 38 and the interlayer contacts 40 arranged under the interlayer connection area 35 of the connection pad, i.e., over the outer area 21 outside of the active element forming area 20. According to various implementations, the wires 38 and the interlayer contacts 40 are used to connect the connection pad 30 to the active element 23. Specifically, the wires 38 formed in the first through the fifth wiring layers 16a through 16e and the interlayer contacts formed in the first through the sixth interlayer dielectric film 14a through 14f arranged outside of the active element-forming area 20 connects the connection pad 30 to the active element 23.

According to various implementations, in the semiconductor integrated circuit, it is not always necessary to arrange the wires 38 and the interlayer contacts 40 for connecting the connection pad 30 to the active element 23 outside of the active element-forming area 20. However, arranging the wires 38 and interlayer contacts 40 outside of the active element-forming area 20 enables to form the reinforcing structures 36A and 36B in the entire area over the portion of the active element-forming area 20, which is located below the probing area 32 and the bonding area 34 of the connection pad 30. Thus, the damage to the active elements 23 can be surely prevented.

Furthermore, according to various implementations, in the exemplary semiconductor integrated circuit 10 shown in FIG. 1, the interlayer contacts 40 in the sixth interlayer dielectric film 14f, which is immediately under the connection pad 30, are arranged only under the interlayer connection area 35. In other words, no interlayer contact 40 that directly contacts the connect pad 30 is arranged under the probing area 32 and the bonding area 34. And the probing area 32 and the bonding area 34 of the connection pad 30 is formed on, and separated from the reinforcing structures 36A and 36B by, a continuous sixth interlayer dielectric film 14f.

Although not always necessary for this invention, such exemplary arrangement of the interlayer contact 40 is effective to prevent the degradation of the connection between the connection pad 30 and the active element 23 by probing or bonding.

In order to enable the stacking of the plurality of wiring layers 16, in the exemplary semiconductor integrated circuit 10 shown in FIG. 1, the upper surface of each of the interlayer dielectric films 14 is made substantially flat. As a result, the upper surface of the connection pad 30 is substantially flat throughout the probing area 32, the bonding area 34, and the interlayer connection area 35.

Figure 2:
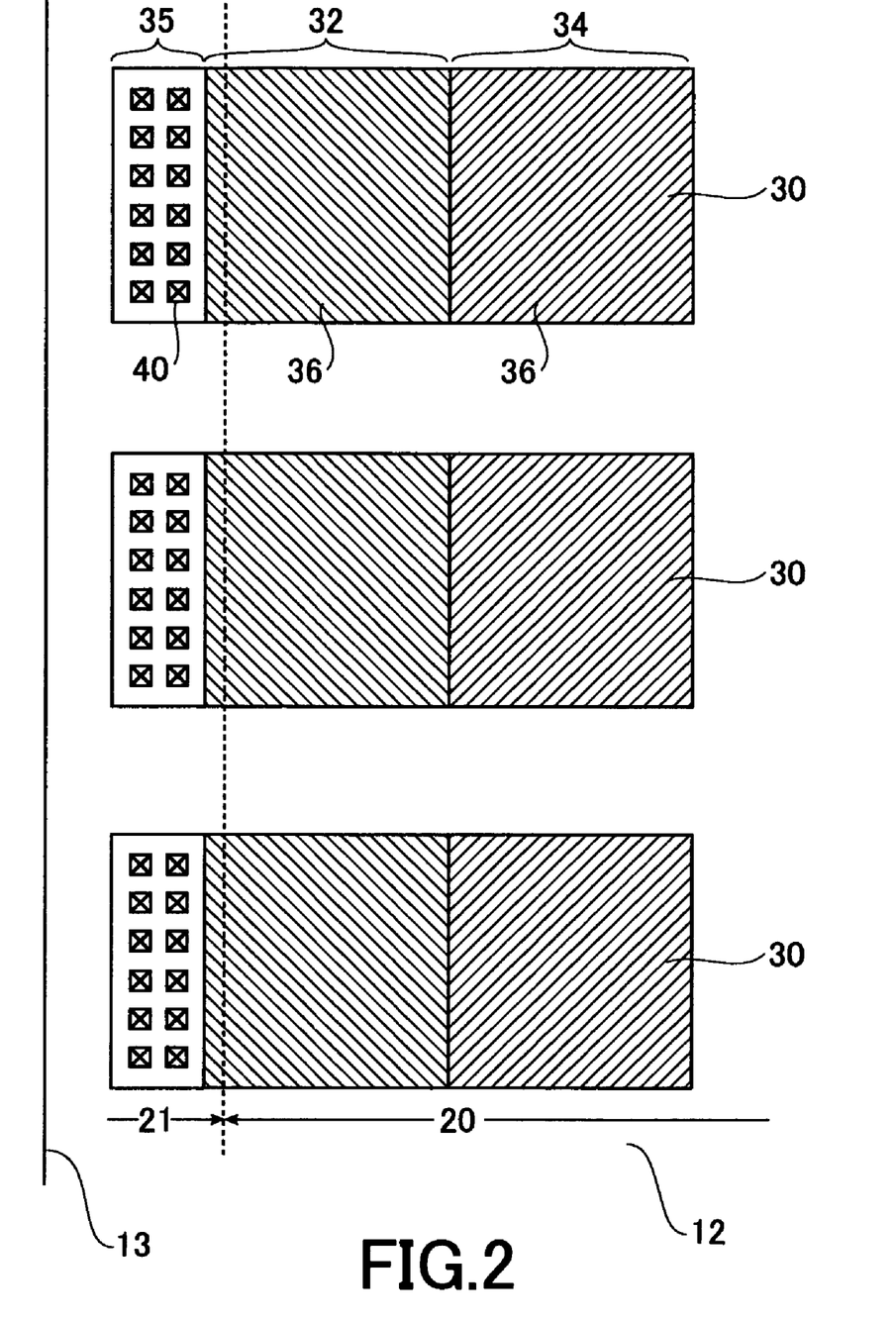
FIG. 2 shows a partial plan-view of the exemplary semiconductor integrated circuit shown in FIG. 1.

Next, referring to FIG. 2, the arrangement of the connection pads 30 in the exemplary semiconductor integrated circuit 10 will be explained. FIG. 2 shows a schematic plan-view of a portion of the exemplary semiconductor integrated circuit 10 according to this invention.

As shown in FIG. 2, the exemplary semiconductor integrated circuit 10 has a plurality of connection pads 30. According to various implementations, these pads are arranged along the sides of the silicon substrate 12 diced into an individual semiconductor integrated circuit chip.

Specifically, FIG. 2 shows three of the connection pads 30 arranged in the vertical direction in the drawing along the left side 13 of the diced silicon substrate 12. The right portion of the semiconductor substrate 12 shown in FIG. 2 is the active element-forming area 20, and the left portion of the semiconductor substrate 12 is the outer area 21. According to various implementations, each of the pads 30 has generally a rectangular shape, and includes, from left to right in FIG. 2, an interlayer connection area 35, the probing area 32 and the bonding area 34.

According to various implementations, under the probing area 32 and the bonding area 34, the reinforcing structures 36A and 36B are formed. Also, under the interlayer connection area 35, the interlayer contacts 40 are arranged.

Next, consideration is made regarding the mechanical stresses applied to the connection pad 30 during the probing and the bonding.

Figure 3:
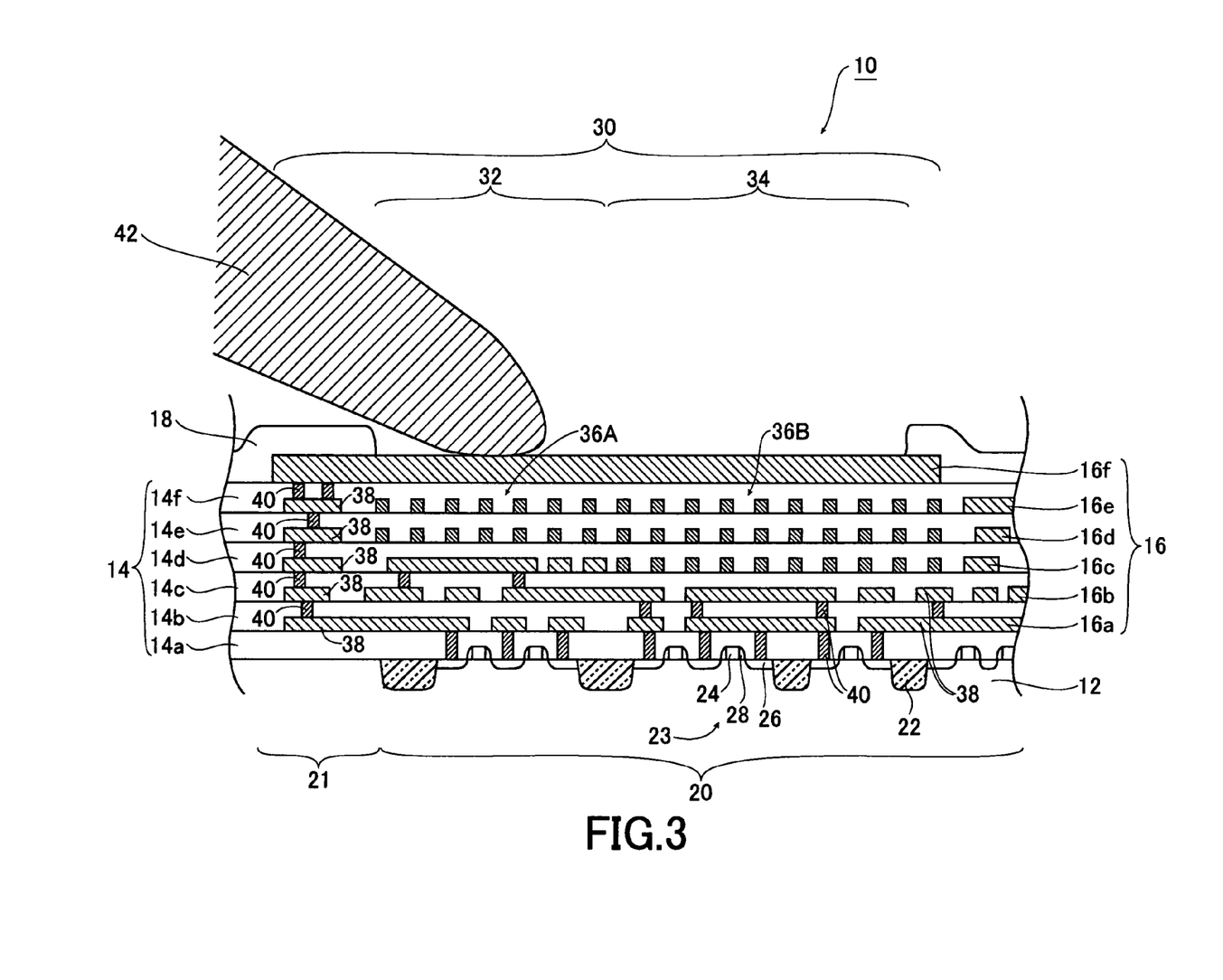
FIG. 3 shows a cross-sectional view of the exemplary semiconductor integrated circuit shown in FIG. 1 during the probing.

FIG. 3 shows a schematic cross-sectional view of the exemplary semiconductor integrated circuit 10, according to various implementations, during probing. As shown in FIG. 3, a probe card having a plurality of probing needles (only one of which is shown in the drawing) is pressed onto the semiconductor integrated circuit 10 so that each of the probing needles 42 electrically contacts a corresponding connection pad 30. Therefore, only the mechanical stress in the downward direction is applies to the pad 30 during probing.

Figure 4:
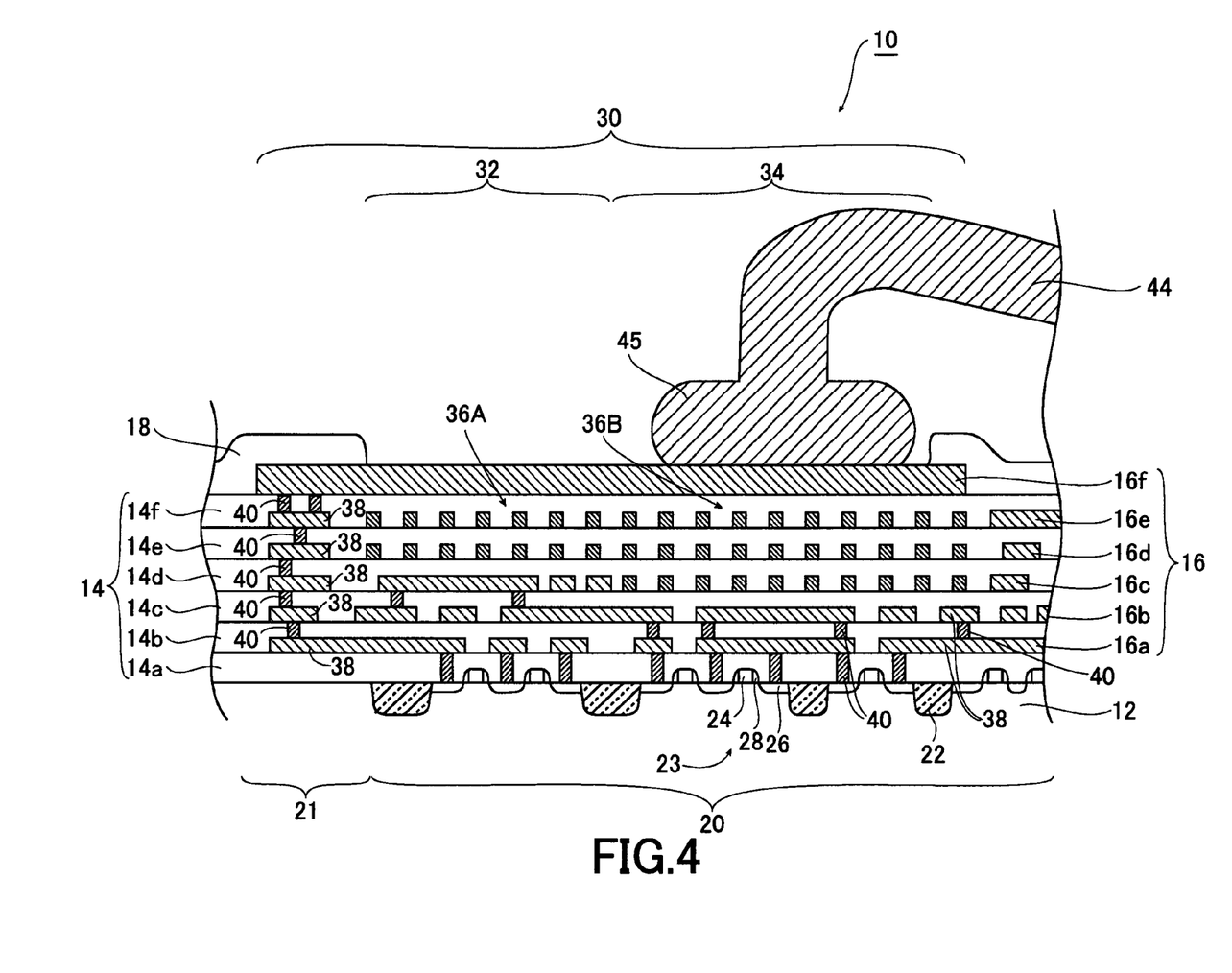
FIG. 4 shows a cross-sectional view of the exemplary semiconductor integrated circuit shown in FIG. 1 during the bonding.

FIG. 4 shows a schematic cross-sectional view of the exemplary semiconductor integrated circuit 10, according to various implementations, during bonding.

According to various implementations, a ball 45 formed at the leading end of the bonding wire 44 is pressed onto the pad 30. According to various implementations, a eutectic alloy is formed at the interface between the ball 45 and the connection pad 30 by applying heat and ultrasonic energy. Thus, the wire 44 is electrically and mechanically connected to the bonding area 34 of the connection pad 30. Thereafter, the other end of the wire 44 is pulled and bonded to a lead frame (not shown). At this time, the connection pad 30 is pulled through the wire 44.

Thus, a mechanical stress both in the downward and in the upward direction is applied to the connection pad 30 during the bonding. Moreover, according to various implementations, heat and ultrasonic energy are also applied to the pad 30 during the bonding.

It can thus be concluded that the stress applied to the connection pad during bonding is significantly higher than that applied during probing. Based on this consideration, in the exemplary semiconductor integrated circuit 10, the reinforcing structures 36A and 36B under the probing area 32 and under the bonding area 34 are formed differently. Specifically, the reinforcing structure 36A under the probing area 32 is formed using a number of wiring layers that is less than the number of wiring layers used for forming the reinforcing structure 36B under the bonding area 34.

If the reinforcing structures 36A and 36B under the probing area 32 and the bonding area 34 were not formed separately, a large number of wiring layers 16 necessary for preventing the damage by the higher stress during bonding have to be used to form the reinforcing structure under the probing area 32 and the bonding area 34.

On the contrary, in the exemplary semiconductor integrated circuit 10 according to this invention, the number of wiring layers used for forming the reinforcing structures 36A and 36B under the probing area 32 and under the bonding area 34 are separately optimized within ranges that are sufficient to prevent damage during probing and bonding, respectively. As a result, the wiring layers 16 under the probing area 32 can be efficiently utilized to form the wires 38 that are part of the circuitry, or the logical function, of the semiconductor integrated circuit 10.

That is, according to various implementations, another ones of the wiring layers 16, or the remaining wiring layers, under the probing area 32 that are not used for forming the reinforcing structure 36A can be utilized to form the wires 38 for realizing the logical function of the semiconductor integrated circuit 10. In other words, according to various implementations, the wiring resources provided by the another ones of the wiring layers 16 under the probing area 32 can be utilized to form the wires 38 for realizing the logical function.

The unused wiring layers, or the unconsumed wiring resources, that can be utilized under the reinforcing structure 36A under the probing area 32 enable to form the wires 38 for forming the circuitry under the connection pad 30. Accordingly, the chip area of the semiconductor integrated circuit 10 can be reduced.

As has been describe above, in various exemplary semiconductor integrated circuits according to this invention, by optimizing the number of wiring layers used for forming the reinforcing structure, it becomes possible to efficiently utilize the wiring layers under the probing area to form wires that realize the logical function of the semiconductor integrated circuit, while preventing any damage to the active elements under the connection pad. As a result, the chip area can be reduced.

While the exemplary embodiment of the semiconductor integrated circuit 10 shown in FIG. 1 utilizes six wiring layers 16a through 16f, this exemplary implementation may be applied to any semiconductor integrated circuits having a plurality of wiring layers. The connection pad 30 may be arranged either entirely or partly over the active element-formation area 20. In the exemplary embodiment shown in FIG. 2, the probing area 32 and the bonding area 34 of the connection pad 30 are closely arranged side-by-side so that the connection pad 30, as a whole, has an overall rectangular shape. However, the probing area 32 and the bonding area 34 of the same connection pad 30 may be arranged apart from each other, and electrically connected with each other via a wire in the same wiring layer or in a different wiring layer. The reinforcing structures 36A and 36B are not limited to those shown in FIG. 1, and may include various other patterns.

For example, U.S. Pat. No. 5,751,065, which is hereby incorporated by reference in its entirety, discloses, as a stress relief, a metal layer 215 immediately under the bond pad 219. The metal layer 215 may or may not be patterned beneath the bond pad 219. U.S. Pat. No. 6,489,228, which is incorporated by reference in its entirety, discloses, as a protection structure, an annular region 21 in a metal layer under the bonding pad 28. The annular region may be floating or form part of the path connecting the pad to the electronic component.

Further, "Reliability of Bond Over Active Pad Structures for 0.13-μm CMOS Technology," 2003 Electronic Components and Technology Conference, pp. 1344-1349 by K. J. Hell et al., which is hereby incorporated by reference in its entirety, discloses a structure called BOA Type A, in which metal wiring and vias are placed below the wirebond pad only at the lowest level. That is, no metal wiring or via is placed below the wirebond pad in the layers other than the lowest level in order to protect the active elements located under the wirebond pad.

Even in this case, wiring layers in which no metal wiring and via is placed are considered to be used for forming the reinforcing structure. In other words, the wiring resources provided by the wiring layers in which no wiring or via is placed are consumed for forming the reinforcing structure, because these layers cannot be utilized to form the wires for realizing the logical function of the integrated circuit.

While this invention has been described in conjunction with the specific embodiments thereof, it is evident that many alternatives, modification, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A semiconductor integrated circuit having a logical function formed on a surface of a semiconductor substrate, comprising:

an active element forming area for forming a plurality of active elements on the surface of the semiconductor substrate;

a plurality of wiring layers over the surface of the semiconductor substrate;

a connection pad formed over the plurality of wiring layers, the connection pad being divided into a probing area for probing and a bonding area for wire bonding, each of the probing area and the bonding area are arranged over the active element forming area;

a first reinforcing structure between the probing area and the active element forming area formed by using at least one of the plurality of wiring layers such that remaining one or more of the plurality of wiring layers including one wiring layer which is directly over the active element forming area is configured to form circuit wires for realizing the logical function of the semiconductor integrated circuit under the first reinforcing structure; and a second reinforcing structure between the bonding area and the active element forming area formed by using the at least one of the plurality of wiring layers and an additional one of the plurality of wiring layers under the at least one of the plurality of wiring layers, wherein the number of the wiring layers containing, between the probing area and the active element area, part of any reinforcing structure is less than the number of the wiring layers containing, between the bonding area and the active element area, part of any reinforcing structure, and reinforcing structures are defined as including dummy patterns, which do not contribute to the logical function of the semiconductor integrated circuit.

2. The semiconductor integrated circuit according to claim 1, wherein the additional one of the plurality of wiring layers is utilized to form at least one of the circuit wires under the first reinforcing structure, and the circuit wires are formed beneath both the probing area and the bonding area.

3. The semiconductor integrated circuit according to claim 1, wherein the at least one of the plurality of wiring layers includes an upper-most one of the plurality of wiring layers.

4. The semiconductor integrated circuit according to claim 1, wherein:

the connection pad includes an interlayer connection area separately from the bonding area and the probing area; and the connection pad is formed on an interlayer dielectric film in which an interlayer contact that contacts the connection pad is arranged under the interlayer connection area.

5. The semiconductor integrated circuit according to claim 4, wherein the interlayer dielectric film is continuous under the probing area and the bonding area of the connection pad.

6. The semiconductor integrated circuit according to claim 4, wherein the surface of the semiconductor substrate includes an outside area separately from the active element forming area, and the connection pad is connected to a corresponding one of the active elements through the interlayer contact arranged over the outside area.

7. The semiconductor integrated circuit according to claim 1, wherein the connection pad is connected to one or more of the active elements beneath the bonding area.

8. A semiconductor integrated circuit having a logical function formed on a surface of a semiconductor substrate, comprising:

an active element forming area for forming a plurality of active elements on the surface of the semiconductor substrate;

a plurality of wiring layers over the surface of the semiconductor substrate;

a connection pad formed over the plurality of wiring layers, the connection pad being divided into a probing area for probing and a bonding area for wire bonding, each of the probing area and the bonding area are arranged over the active element forming area;

circuit wires for realizing the logical function of the semiconductor integrated circuit;

a first reinforcing structure between the probing area and the active element forming area formed by using at least one of the plurality of wiring layers such that remaining one or more of the plurality of wiring layers including one wiring layer which is directly over the active element forming area is configured to form some of the circuit wires; and a second reinforcing structure between the bonding area and the active element forming area, wherein:

the circuit wires are formed in at least one of the plurality of wiring layers under the bonding area and also in the at least one of the plurality of wiring layers and in an additional one of the plurality of wiring layers over the at least one of the plurality of wiring layers under the probing area;

the first reinforcing structure is formed over the additional one of the plurality of wiring layers;

the second reinforcing structure is formed over the at least one of the plurality of wiring layers, the number of the wiring layers containing, between the probing area and the active element area, part of any reinforcing structure is less than the number of the wiring layers containing, between the bonding area and the active element area, part of any reinforcing structure, and reinforcing structures are defined as including dummy patterns, which do not contribute to the logical function of the semiconductor integrated circuit.

9. The semiconductor integrated circuit according to claim 8, wherein none of the circuit wires is formed in the additional one of the plurality of wiring layers under the bonding area, and the circuit wires are formed beneath both the probing area and the bonding area.

10. The semiconductor integrated circuit according to claim 8, wherein:

the connection pad includes an interlayer connection area separately from the bonding area and the probing area; and the connection pad is formed on an interlayer dielectric film in which an interlayer contact that contacts the connection pad is arranged under the interlayer connection area.

11. The semiconductor integrated circuit according to claim 10, wherein the interlayer dielectric film is continuous under the probing area and the bonding area of the connection pad.

12. The semiconductor integrated circuit according to claim 8, wherein the connection pad is connected to one or more of the active elements beneath the bonding area.

13. A semiconductor integrated circuit having a logical function formed on a surface of a semiconductor substrate, comprising:

an active element forming area on the surface of the semiconductor substrate for forming a plurality of active elements;

a plurality of wiring layers for providing wiring resources over the surface of the semiconductor substrate;

a connection pad formed over the plurality of wiring layers, the connection pad being divided into a probing area for probing and a bonding area for wire bonding, each of the probing area and the bonding area are arranged over the active element forming area;

a first reinforcing structure between the probing area and the active element forming area formed by consuming a first portion of the wiring resources under the probing area provided by at least one of the plurality of wiring layers so that a remaining portion of the wiring resources provided by remaining one or more of the plurality of wiring layers including one wiring layer which is directly over the active element forming area is configured to form circuit wires for realizing the logical function of the semiconductor integrated circuit under the first reinforcing structure; and a second reinforcing structure between the bonding area and the active element forming area formed by consuming a second portion of the wiring resources under the bonding area provided by the at least one of the plurality of wiring layers and an additional one of the plurality of wiring layers under the at least one of the plurality of wiring layers, wherein the number of the wiring layers containing, between the probing area and the active element area, part of any reinforcing structure is less than the number of the wiring layers containing, between the bonding area and the active element area, part of any reinforcing structure, and reinforcing structures are defined as including dummy patterns, which do not contribute to the logical function of the semiconductor integrated circuit.

14. The semiconductor integrated circuit according to claim 13, wherein at least one of the circuit wires is formed in the additional one of the plurality of wiring layers under the first reinforcing structure, and the circuit wires are formed beneath both the probing area and the bonding area.

15. The semiconductor integrated circuit according to claim 13, wherein:

the connection pad includes an interlayer connection area separately from the bonding area and the probing area; and the connection pad is formed on an interlayer dielectric film in which an interlayer contact that contacts the connection pad is arranged under the interlayer connection area.

16. The semiconductor integrated circuit according to claim 15, wherein the interlayer dielectric film is continuous under the probing area and the bonding area of the connection pad.

17. The semiconductor integrated circuit according to claim 13, wherein the connection pad is connected to one or more of the active elements beneath the bonding area.

* * * * *